US008987906B2

(12) United States Patent
Sandhu et al.

(10) Patent No.: US 8,987,906 B2
(45) Date of Patent: Mar. 24, 2015

(54) METHOD FOR PROVIDING ELECTRICAL CONNECTIONS TO SPACED CONDUCTIVE LINES

(71) Applicant: Micron Technology, Inc., Boise, ID (US)

(72) Inventors: Gurtej Sandhu, Boise, ID (US); Scott Sills, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/258,476

(22) Filed: Apr. 22, 2014

(65) Prior Publication Data

US 2014/0225264 A1 Aug. 14, 2014

Related U.S. Application Data

(63) Continuation of application No. 14/096,052, filed on Dec. 4, 2013, now Pat. No. 8,735,285, which is a continuation of application No. 13/751,781, filed on Jan. 28, 2013, now Pat. No. 8,629,051, which is a (Continued)

(51) Int. Cl.
*H01L 23/528* (2006.01)
*H01L 21/3213* (2006.01)

(Continued)

(52) U.S. Cl.
CPC ...... *H01L 23/5283* (2013.01); *H01L 21/32139* (2013.01); *H01L 21/76895* (2013.01); *H01L 23/528* (2013.01); *H01L 27/10885* (2013.01); *H01L 27/10891* (2013.01);

(Continued)

(58) Field of Classification Search
CPC .............. H01L 23/5283; H01L 23/528; H01L 27/10891; H01L 21/823871; H01L 21/76877; H01L 21/28518
See application file for complete search history.

(56) References Cited

U.S. PATENT DOCUMENTS 3,881,244 A 5/1975 Kendall
5,336,921 A 8/1994 Sundaram et al.
(Continued)

FOREIGN PATENT DOCUMENTS

CN 101164147 4/2008
JP 10-116829 A 5/1998
(Continued)

OTHER PUBLICATIONS

Black, C.T., et al., "Polymer Self Assembly in Semiconductor Microelectronics", 51 IBM J. Res. & Dev. 605, IBM 1997.
Chai, J. et al., "Assembly of Aligned Linear Metallic Patterns on Silicon", 2 Nature Nanotechnology 500, Nature Publishing Group 2007.

*Primary Examiner* — William D Coleman
(74) *Attorney, Agent, or Firm* — Dickstein Shapiro LLP

(57) ABSTRACT

An integrated circuit and a method of formation provide a contact area formed at an angled end of at least one linearly extending conductive line. In an embodiment, conductive lines with contact landing pads are formed by patterning lines in a mask material, cutting at least one of the material lines to form an angle relative to the extending direction of the material lines, forming extensions from the angled end faces of the mask material, and patterning an underlying conductor by etching using said material lines and extension as a mask. In another embodiment, at least one conductive line is cut at an angle relative to the extending direction of the conductive line to produce an angled end face, and an electrical contact landing pad is formed in contact with the angled end face.

20 Claims, 21 Drawing Sheets

Related U.S. Application Data continuation of application No. 13/235,939, filed on Sep. 19, 2011, now Pat. No. 8,383,504, which is a continuation of application No. 12/469,495, filed on May 20, 2009, now Pat. No. 8,043,964.

(51) Int. Cl.
  *H01L 21/768* (2006.01)
  *H01L 27/108* (2006.01)
  *H01L 21/308* (2006.01)
  *H01L 21/28* (2006.01)
  *H01L 21/285* (2006.01)
  *H01L 21/8238* (2006.01)

(52) U.S. Cl.
  CPC ..... *H01L 21/3081* (2013.01); *H01L 21/28008* (2012.01); *H01L 21/28518* (2013.01); *H01L 21/76877* (2013.01); *H01L 21/823871* (2013.01); *H01L 2924/12044* (2013.01); *H01L 2224/06138* (2013.01)
  USPC ........................................................ 257/754

(56) References Cited

U.S. PATENT DOCUMENTS

| | | |
|---|---|---|
| 5,378,649 A | 1/1995 | Huang |
| 5,477,067 A | 12/1995 | Isomura et al. |
| 6,614,093 B2 | 9/2003 | Ott et al. |
| 7,413,833 B2 | 8/2008 | Butt et al. |
| 8,735,258 B2 * | 5/2014 | Ko et al. ................ 438/382 |
| 2008/0050873 A1 | 2/2008 | Cheng et al. |
| 2008/0057692 A1 | 3/2008 | Wells et al. |
| 2008/0237714 A1 | 10/2008 | Fazan |
| 2009/0032959 A1 | 2/2009 | Black et al. |
| 2009/0045061 A1 | 2/2009 | Farrow et al. |

FOREIGN PATENT DOCUMENTS

| | | |
|---|---|---|
| JP | 2006-173186 A | 6/2006 |
| JP | 2006-186104 A | 7/2006 |
| JP | 2006-310707 A | 11/2006 |
| JP | 2009-42660 A | 2/2009 |

\* cited by examiner

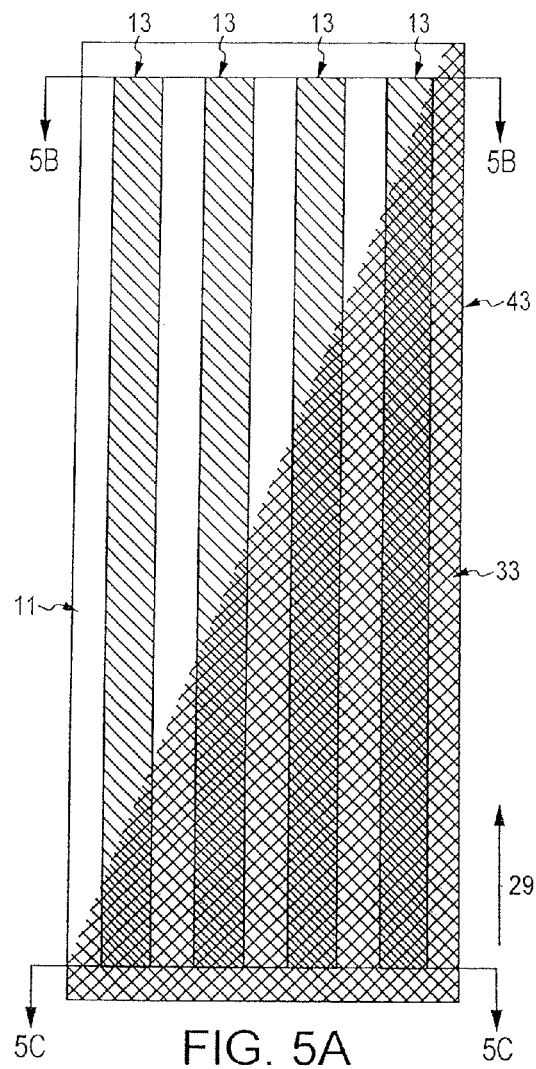
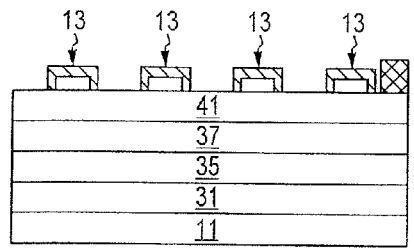
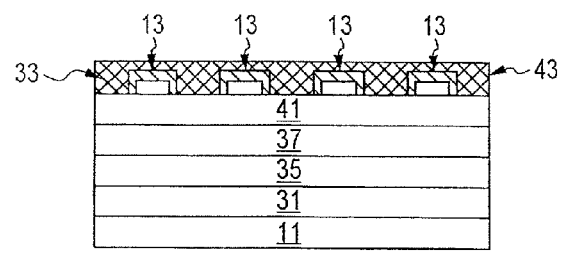
FIG. 5A
FIG. 5B
FIG. 5C

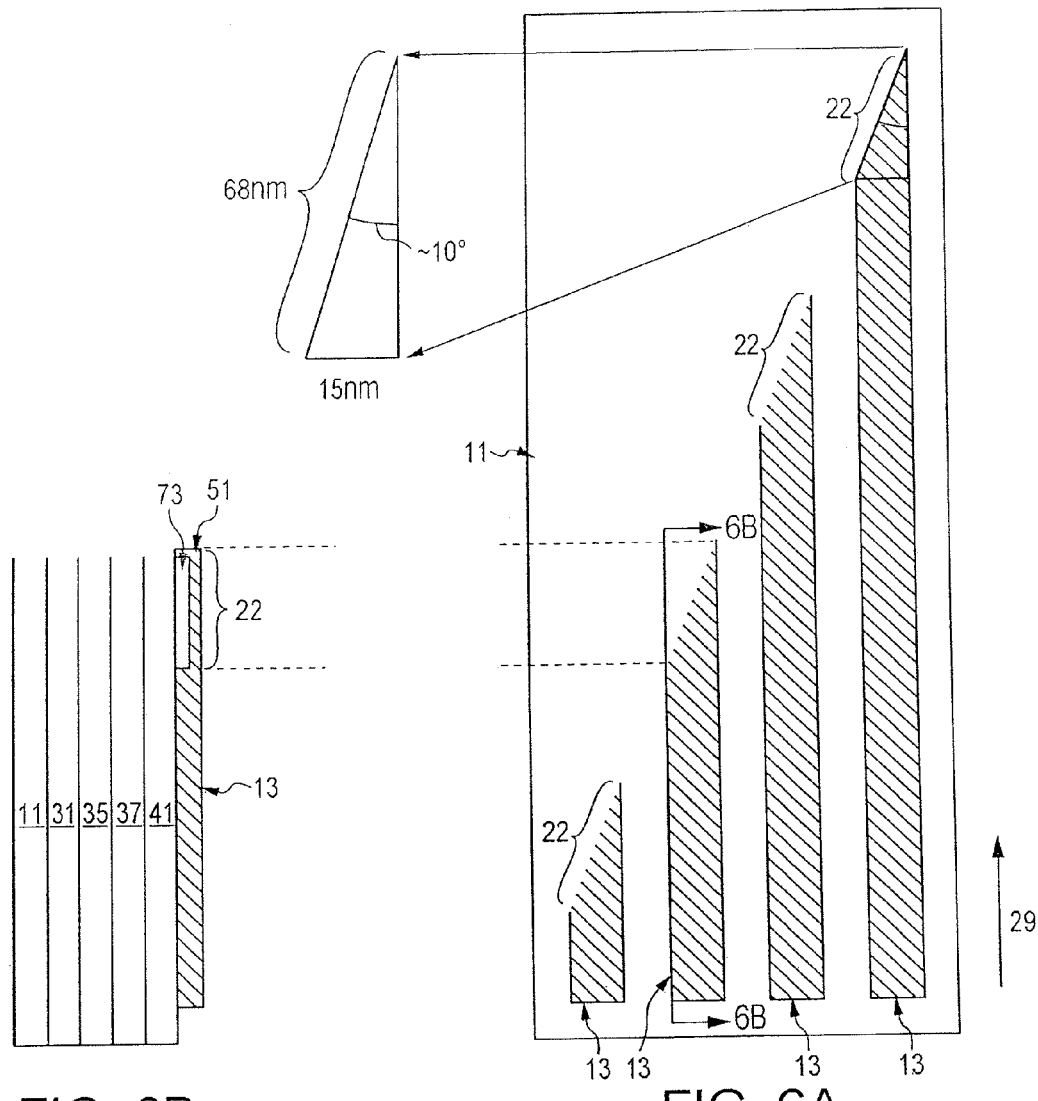

METHOD FOR PROVIDING ELECTRICAL CONNECTIONS TO SPACED CONDUCTIVE LINES

CROSS-REFERENCE TO RELATED APPLICATIONS

The present application is a continuation of U.S. patent application Ser. No. 14/096,052, filed Dec. 4, 2013, which is a continuation of U.S. patent application Ser. No. 13/751,781, filed Jan. 28, 2013 (now U.S. Pat. No. 8,629,051, issued Jan. 14, 2014), which is a continuation of U.S. patent application Ser. No. 13/235,939, filed Sep. 19, 2011 (now U.S. Pat. No. 8,383,504, issued Feb. 26, 2013), which is a continuation of U.S. patent application Ser. No. 12/469,495, filed May 20, 2009 (now U.S. Pat. No. 8,043,964, issued Oct. 25, 2011), the disclosures of which are incorporated herein by reference in their entirety.

FIELD OF THE INVENTION

Embodiments described herein relate generally to the fabrication of integrated circuits, and more specifically to providing electrical connections to spaced conductive lines, e.g. spaced parallel lines, in integrated circuits.

BACKGROUND OF THE INVENTION

Electrically conductive lines form many common components of integrated circuits. Dynamic random access memory (DRAM) circuitry, for example, incorporates multiple parallel conductive lines to form wordlines and bitlines. In order to increase capacity and accommodate smaller devices, there is constant pressure to increase the density of components on these and other circuits. The continual reduction in feature sizes places greater demands on the techniques used to form the features.

Photolithography is a commonly used technique for patterning integrated circuit features. One example of a photolithographic method for forming conductive lines using conventional photolithographic techniques is illustrated in FIGS. 1A through 1D. FIG. 1A shows a substrate 11, such as a semiconductor substrate or an insulating material substrate. For forming word lines on a semiconductor substrate 11, materials are sequentially deposited over a semiconductor substrate 11, including a gate oxide material 31, a polysilicon material 35, a metal silicide material 37, and an oxide top material 41. The last set of materials deposited comprise a photo patterning stack, which may include photoresist anti-reflective coatings and hardmask materials. Any photoresist materials 33 may be used for the photo patterning stack, including positive photoresist materials (such as DNQ-Novolac) and negative photoresist materials (such as SU-8). In this example, a negative photoresist is used, so that when the photoresist material 33 is exposed to light through a mask (at portions 60, 61) and developed, the area that has not been exposed to light is dissolved.

FIG. 1B shows the remaining photoresist material 33 after unexposed portions of the material have been removed. The remaining photoresist material 33 is used as an etch mask for an etching process. In the etching process, portions of the of the gate oxide 31, polysilicon 35, metal silicide 37 and oxide top material 41 that are not covered by the photoresist material 31 are removed by, for example, wet or dry chemical etch. After the etch, the remaining photoresist material 33 is dissolved. FIG. 1C illustrates a cross sectional view of the resulting stack. Once the desired layers have been patterned, an encapsulation insulating material 51 can be deposited and etched. Any suitable insulating material 51, such as an oxide, may be used. FIG. 1D shows an insulating material 51 that has been deposited over the materials and etched from the substrate 11. The encapsulation covers the top and both sides of the underlying materials 31, 35, 37, and 41. Other known techniques for forming an encapsulation insulating material 51 over the materials 31, 35, 37 and 41 can also be used.

There are limitations on how close line features, such as conductive lines, can be patterned using such known photolithographic techniques. The size of line features on an integrated circuit are conventionally described by their "pitch," which is the distance between an identical point on two neighboring features. Features are typically defined by spaces between adjacent features, and so the pitch can be viewed as the sum of the width of a line feature (x in FIG. 1D) and the width of the space separating that line feature from a neighboring line feature (y in FIG. 1D). The "half pitch" is half the sum of the feature width x and the width y of the space between features. Due to factors such as optics and light or radiation wavelength, there is a minimum pitch below which line features cannot be reliably formed using conventional photolithographic techniques. Conventional photolithographic techniques, one example of which is illustrated in FIGS. 1A-1D, can form parallel spaced conductive lines with a half pitch as low as about 45 nm. More advanced photolithographic techniques, such as double patterning and spacer pitch doubling, enable the formation of conductive lines with a half pitch as low as about 20 nm. Examples of these techniques can be found in U.S. Pat. No. 5,378,649 to Huang (double-patterning), and U.S. Pat. No. 5,328,810 to Lowrey et al. (spacer pitch doubling).

Recently developed non-lithographic techniques, such as polymer self assembly, have also made it possible to form parallel conductive lines with even smaller spacing between adjacent lines. For example, using block copolymer (BCP) self assembly, conductive lines with a half pitch below 20 nm are achievable. FIGS. 2A and 2B illustrate patterns formed using BCP self assembly techniques. The process of forming self-assembled patterns involves the deposition of a thin BCP film composed of, for example, polystyrene (PS) and polymethylmethacrylate (PMMA) (referred to as PS-b-PMMA). This is followed by thermal annealing above the glass transition temperature of the BCP. The quality of the resulting pattern depends on process conditions including film thickness, annealing time, and annealing temperature. FIG. 2A illustrates BCP cylinders 80 (comprising, for example, PS) formed in a matrix phase material 82 (comprising, for example PMMA). Notice that the cylinders do not naturally align in a symmetrical pattern. Various methods can be employed in order to control the orientation of the cylinders, including the use of external thermal or electric fields, shear stress or flow, chemical nanopatterning, or graphoepitaxy. FIG. 2B illustrates parallel spaced copolymer cylinders 80 formed using a graphoepitaxy technique, wherein surface relief (in the form of trenches 84) is used to induce orientation.

Once formed, the BCP cylinders 80 can be used as a sacrificial template for patterning underlying materials, similar to the way photoresist material is used in conventional photolithographic methods. To accomplish this, the PMMA material is chemically removed by exposure to UV light and immersion in a developer, such as an acetic acid developer. The remaining PS cylinders can then be used as a mask to etch underlying materials, such as a conductive material or (more typically) a hardmask. BCP cylinders 80 can also be metalized to function as conductive lines. BCP cylinders 80 can be metalized by, for example, soaking the cylinders in an acidic metal salt solution. For more information on BCP self assembly techniques, see C. T. Black, et al., *Polymer Self Assembly in Semiconductor Microelectronics,* 51 IBM J. Res. & Dev. 605 (IBM 1997) and J. Chai, et al., *Assembly of Aligned Linear Metallic Patterns on Silicon,* 2 Nature Nanotechnology 500 (Nature Publishing Group 2007).

As techniques such as double patterning, spacer pitch doubling, and BCP self-assembly enable the creation of more closely spaced conductive lines, it becomes increasingly difficult to make an electrical connection to a particular line without overlapping and shorting between adjacent lines. Using traditional lithographic techniques, electrical connection pad sites also known as contact landing pads are too large to make contact with only a single conductive line in a group of closely spaced conductive lines. Present lithography technology does not have the resolution or alignment capability to print the patterns necessary to make connection sites for these smaller features. Thus, there exists a need for a technique to make electrical connections to closely spaced conductors and which may also be used to make electrical connections to any spaced apart parallel conductors.

BRIEF DESCRIPTION OF THE DRAWINGS

FIGS. 5A through 5C illustrate top down and cross-sectional views of parallel mask lines partially covered by a cutting mask.

FIGS. 6A and 6B illustrate top down and cross-sectional views of mask lines after etching angled line ends using the cutting mask illustrated in FIGS. 5A through 5C.

DETAILED DESCRIPTION OF THE INVENTION

Embodiments described herein address the problems with current techniques for making electrical connections to closely spaced conductive lines, e.g. parallel lines with spacing of less than 45 nm in width, and provide electrical connections to such closely spaced conductive lines. The embodiments described herein can also be used to make electrical connections to any spaced conductive lines including those formed using conventional photolithographic techniques.

It should be understood that embodiments of the invention are not limited by the example embodiments described herein and that changes can be made thereto. The embodiments described herein can be applied to any integrated circuit that has spaced lines, and is particularly suitable for making connections to parallel conductive lines including closely spaced parallel conductive lines, for example, parallel conductive lines having a spacing of 45 nm or less between them, and more particularly to such conductive lines having a spacing of 20 nm or less between them. These embodiments are particularly well suited for application to memory technology such as dynamic random access memory (DRAM) and other memory devices, which contain closely spaced access lines, for example wordlines and data/source lines, for example bitlines, and to other integrated circuit structures having closely spaced parallel conductive lines.

The term "substrate" in the following description refers to any supporting material suitable for fabricating an integrated circuit, typically a semiconductor material, but not necessarily so. A substrate may be silicon-based, may include epitaxial layers of silicon supported by a base semiconductor foundation, can be sapphire-based, silicon-on-insulator (SOI), metal, polymer, or any other materials suitable for supporting an integrated circuit. When reference is made to a semiconductor substrate in the following description, previous process steps may have been utilized to form regions or junctions in or over a base semiconductor or foundation.

Figure 1A:
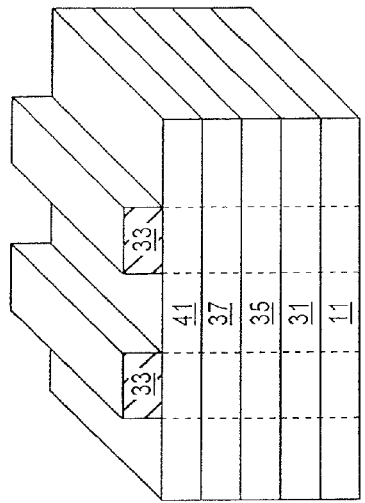
FIGS. 1A through 1D illustrate a conventional photolithographic method of forming conductive lines over a substrate.
Figure 1B:
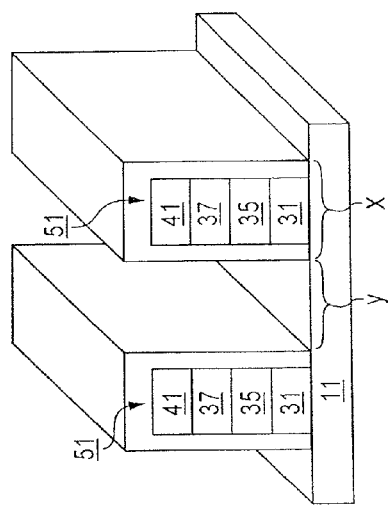
Figure 1C:
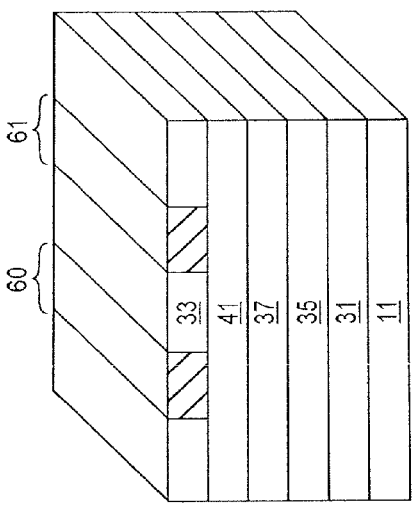
Figure 1D:
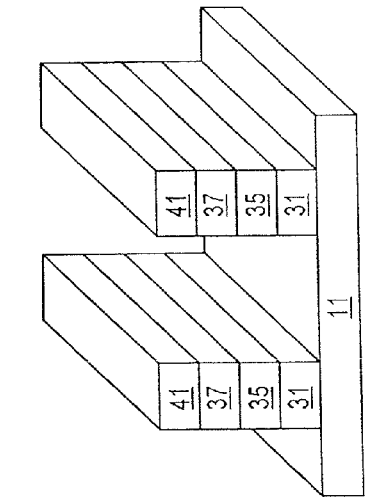
Figure 2A:
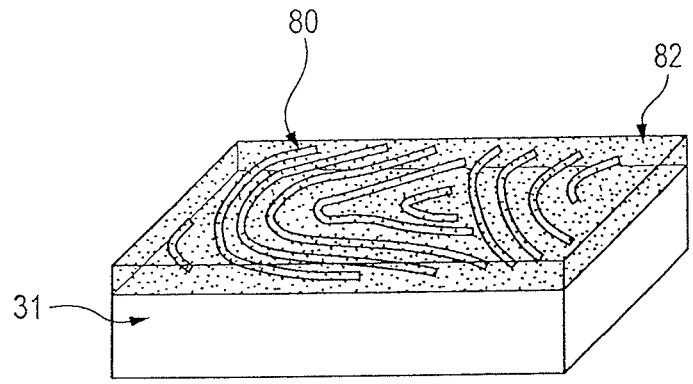
FIGS. 2A and 2B illustrate self-assembled block copolymer (BCP) patterns.
Figure 2B:
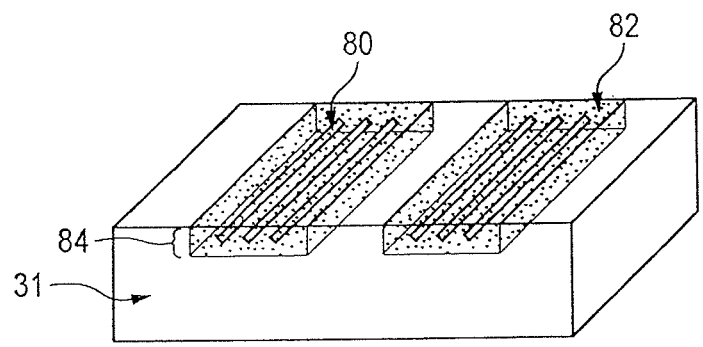
Figure 3A:
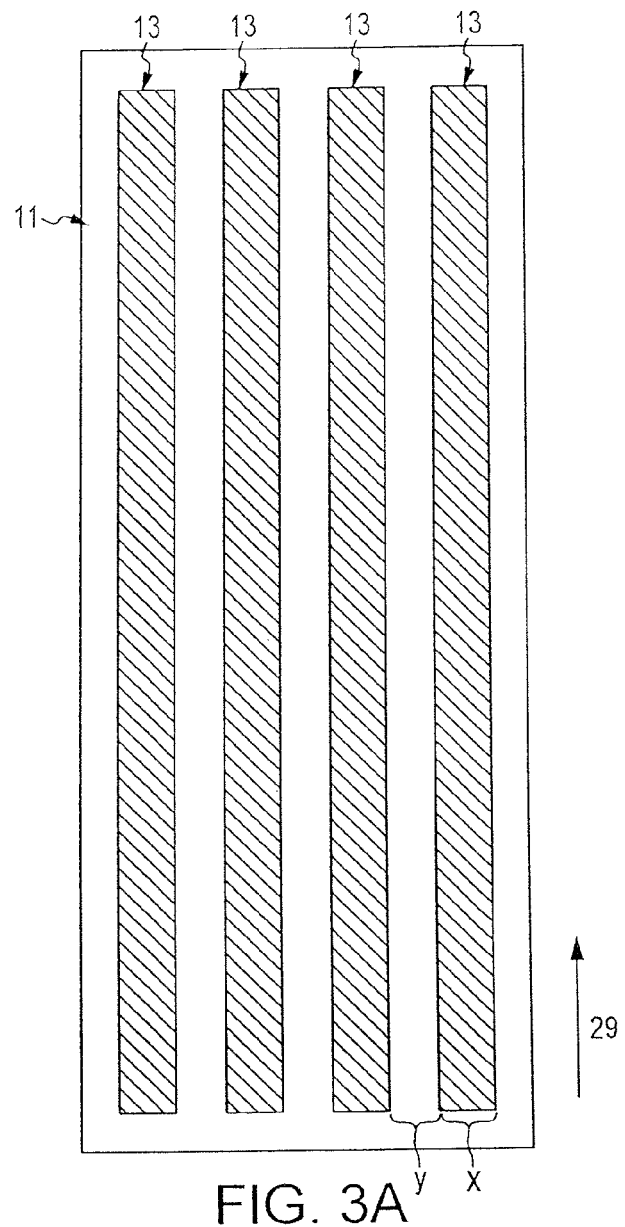
FIGS. 3A and 3B illustrate top down and cross-sectional views of parallel mask lines formed on a substrate.
Figure 3B:
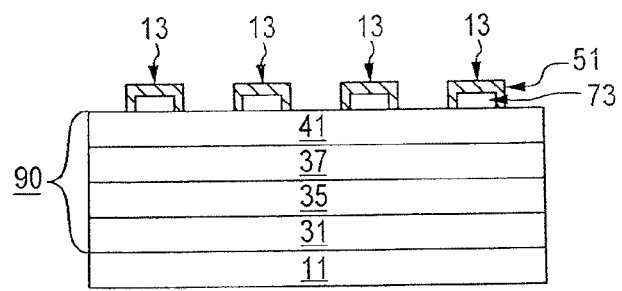

Example embodiments are now described with reference to the accompanying figures wherein like reference numbers are used consistently for like features throughout the drawings. FIGS. 3A and 3B illustrate top down and cross-sectional views of parallel spaced mask lines 13 formed over blanket deposited gate stack materials 90, for example, gate stack materials 90 comprising a gate oxide 31, a polysilicon 35, a metal silicide 37, and an oxide top material 41 formed over a semiconductor substrate 11. Though shown here over gate stack materials 90 on a semiconductor substrate 11, the mask lines 13 could be formed above any conductive material of an integrated circuit, including a metal layer. The mask lines 13 comprise a layer of mask material 73 encapsulated by an encapsulation insulating material 51, such as an oxide. The mask material 73 may be any material suitable for use as an etch mask, including photoresist, hardmask, and processed BCP materials, as examples. The mask lines 13 can be formed by any now known or later developed techniques, including photolithographic techniques and BCP techniques and others used to fabricate closely spaced lines. The mask lines 13 are arranged, in this embodiment, in parallel and extend linearly in one extending direction 29, with a width x and a space y between them. For mask lines 13 formed using current double patterning and spacer pitch doubling techniques, the total mask line width x and space y between mask lines may be between 90 nm (a half pitch of 45 nm) and 40 nm (a half pitch of 20 nm). Using BCP self assembly techniques, a mask line with a total line width x and space between y of less than 40 nm (a half pitch of 20 nm) can be patterned.

Figure 4A:
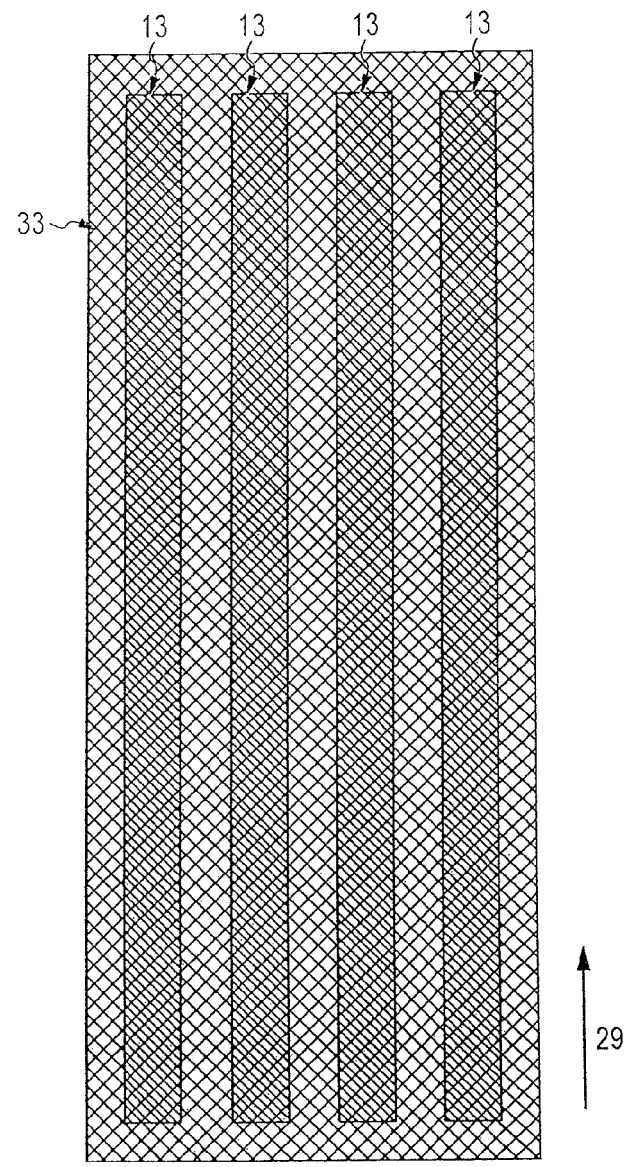
FIGS. 4A and 4B illustrate top down and cross-sectional views of parallel mask lines formed on a substrate covered with a photoresist material.
Figure 4B:
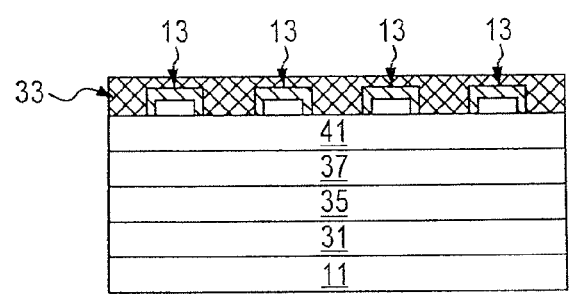

Starting with FIGS. 3A and 3B, one example embodiment for forming connections to closely spaced conductive lines is now described. FIGS. 4A and 4B illustrate top down and cross-sectional views of the FIGS. 3A, 3B structure covered with a light-sensitive photoresist material 33. Any common photoresist material 33 may be used, including positive photoresist materials (such as DNQ-Novolac) and negative photoresist materials (such as SU-8).

Using conventional photolithographic techniques, the photoresist material 33 is selectively exposed to radiation through a mask patterned diagonally across the mask lines 13 so that, when exposed to a suitable developer, the exposed (or unexposed—depending on whether the material is a positive or negative photoresist material) areas of the photoresist are removed. As shown in FIGS. 5A, 5B, 5C, the remaining photoresist material 33 provides an angled profile and forms a cutting mask 43, which can be used to remove exposed materials of the mask lines 13. FIG. 5A illustrates a cutting mask 43 that has been formed at an angle, e.g. between about 5 degrees and 30 degrees relative to the linearly extending direction 29, across the mask lines. FIG. 5B shows a cross-section at a location where the photoresist material 33 has been removed, and FIG. 5C shows a cross-section at a location where the photoresist material 33 forming the cutting mask 43 remains, covering the mask lines 13.

Next, the area not covered by the cutting mask 43 is etched down to oxide top material 41, removing the exposed portions of the mask lines 13. The remaining photoresist 33 is then removed. FIGS. 6A and 6B illustrate top down and cross-sectional views after the photolithographic and etch process has been completed, and the remaining photoresist material 33 forming the cutting mask 43 has been removed. The mask lines 13 have been cut cross-wise at a diagonal to create angled ends 22. Because of the angled profile of cutting mask 43, each mask line 13 is cut at a different linearly extending location along the extending direction 29 of the lines 13. In the embodiment illustrated in FIGS. 6A and 6B, and as one example, the mask lines 13 may have a width of 15 nm, and the cut forms an angle of approximately 10 degrees at the angled ends 22. The resulting length of the exposed angled end 22 is about 68 nm, presenting a surface significantly longer than the 15 nm width of the mask lines 13. This provides a larger surface area for creating a mask extension for use in forming an electrical contact landing pad, as described below, than if the mask lines 13 were cut cross-wise to form square ends. Additionally, the overall layout of the mask lines 13—wherein the parallel lines are cut at different respective lengths along the extending direction 29—provides a larger usable area for forming mask extensions.

Figure 7:
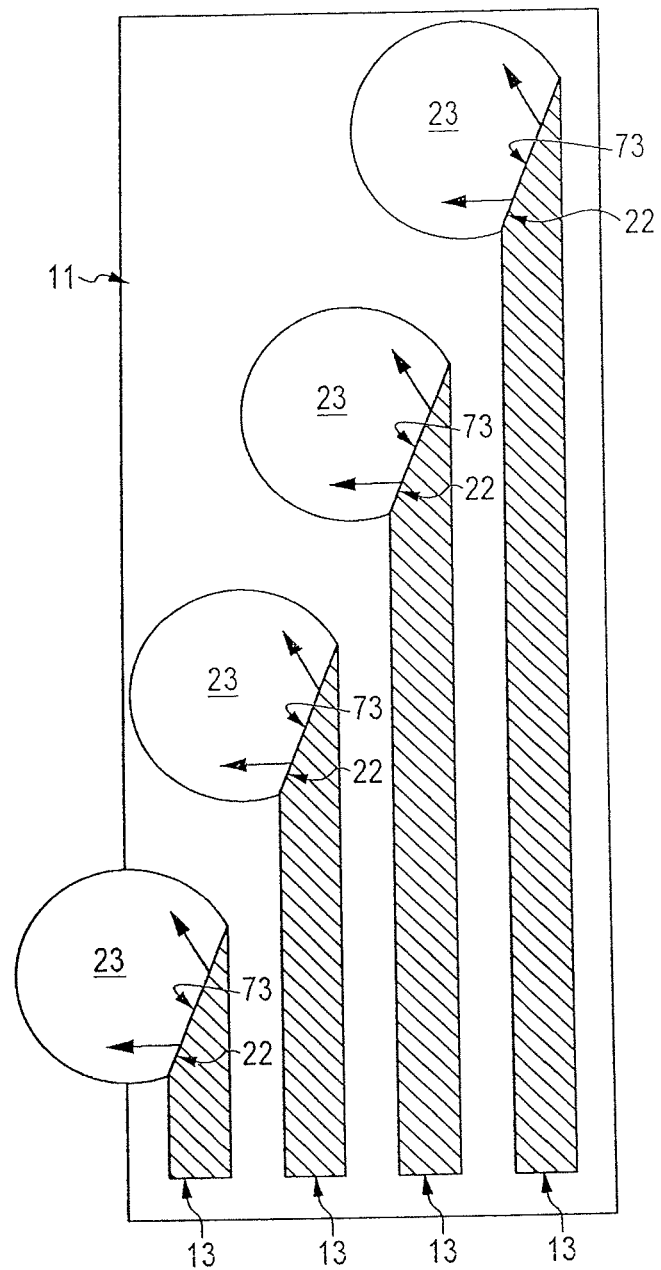
FIG. 7 illustrates a top down view of an embodiment with parallel mask lines having angled faces and isotropically grown contact landing pad masks.
Figure 8:
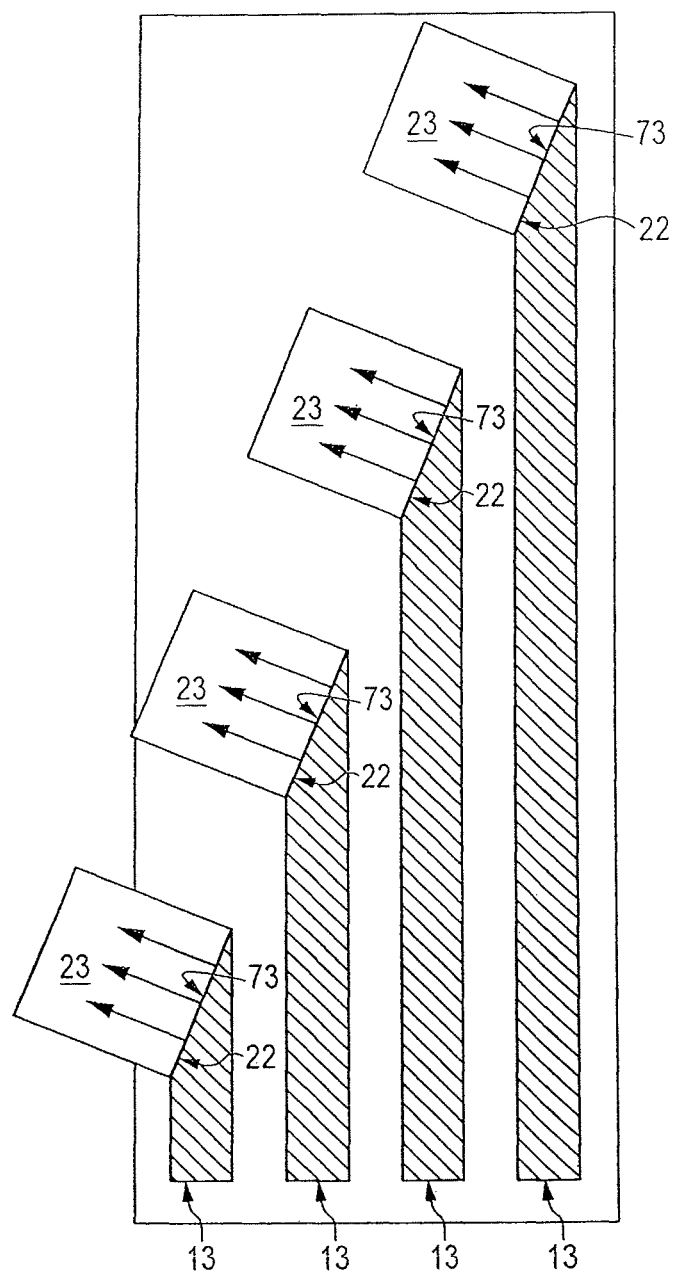
FIG. 8 illustrates a top down view of an embodiment with parallel mask lines having angled faces and anisotropically grown contact landing pad masks.
Figure 9A:
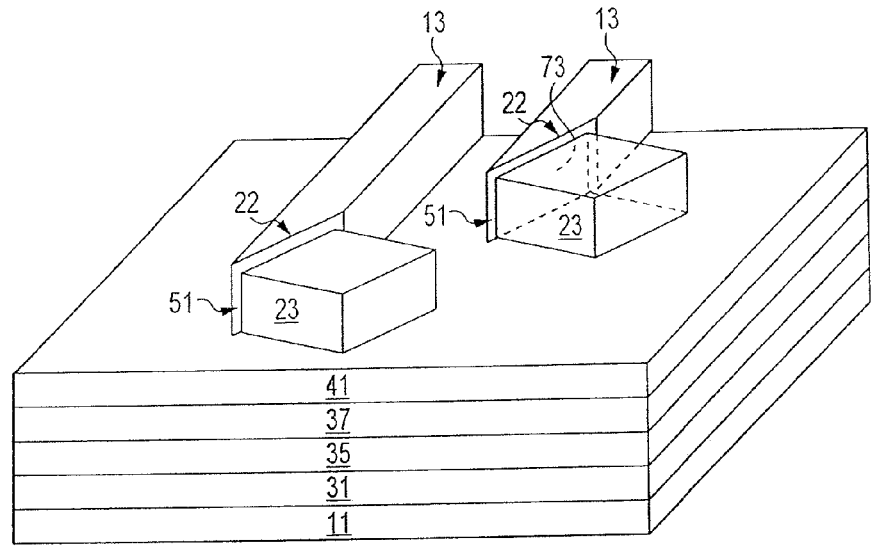
FIGS. 9A through 9C illustrate perspective and cross-sectional views of an embodiment with parallel conductive lines with electrical contact landing pad areas formed by using mask lines and contact landing pad masks as an etch mask.

Next, extensions of the parallel mask lines 13, here shown as contact landing pad masks 23, are formed at the angled ends 22 of the parallel mask lines 13, as shown in FIGS. 7, 8, and 9A. The contact landing pad masks 23 are formed by using a material 73 exposed at the angled ends 22 of the mask lines 13 as seed to grow a contact landing pad mask 23 next to the exposed angled ends 22 of each mask line 13. Because the material 73 at the exposed angled ends 22 of each mask line 13 is the nucleation seed for subsequent growth of contact landing pad masks 23, the pad masks 23 are self-aligned to the line ends 22. The self-aligned nature avoids overlay and pattern registration errors associated with photolithographical patterning methods. FIG. 7 shows isotropic growth of contact landing pad masks 23, and FIGS. 8 and 9A show contact landing pad masks 23 grown anisotropically. Various methods can be used to grow self aligned contact landing pad masks 23 from the mask line 13 materials, depending on the composition of the material 73 within mask lines 13.

For example, the mask material 73 of the mask lines 13 may be a polymer, such as photoresist material or self-assembled BCP cylinders. In this example, a seed material for selective deposition can been blended with the polymer, or a seed species can be included in the molecular structure of the polymer. For example, a metal seed material may be incorporated in the polymer structure as an organometallic material (by blending) or organometallic functional group (by reacting). After forming the polymer mask 13, the organometallic may or may not be reduced (or oxidized) to facilitate its activity as a seed material, via, e.g. thermal baking or irradative exposure). Alternatively, if seed material is not pre-blended with the polymer, a seed layer may be selectively formed at the angled ends 22 of mask lines 13 by functionalizing a seed material to react with and bond to exposed polymer material 73 at the angled ends 22. The seed material may also be selectively formed on the polymer mask material 73 exposed at the angled ends 22 by using conventional staining techniques. If the mask material 73 is a photoresist, the material 73 may or may not be treated to render them insoluble in the solvent from which the photoresist material 33 of the cutting mask 43 is cast. Such treatment may include thermal cross-linking, acid catalyzed cross-linking, or other commercial "freeze" treatments used for double-patterning photolithography.

In these examples, where the mask material is a seeded polymer material, extension contact landing pad masks 23 are grown via selective deposition of materials onto the seed material at the angled ends 22. Any now known or later developed selective deposition technique can be used to deposit materials on the seed material. For example, if the seed material is a metal material, then selective chemical vapor deposition (CVD) techniques can be used to deposit materials such as tungsten (W) or titanium (Ti), or Atomic layer deposition (ALD) techniques can be used to deposit materials such as platinum (Pt) and rhodium (Rh) on the seeded material 73. Materials can also be deposited on a metal seeded material 73 using electroless plating techniques, including electroless plating of nickel (Ni), nickel alloy (e.g. NiCoW), cobalt (Co), etc.

The mask material 73 of the mask lines 13 could also be a hardmask material, such as silicon, polysilicon, or metal. In this example, the extension contact landing pad masks 23 can be grown via selective deposition of materials directly on the mask material 73 exposed at the angled ends 22 of the mask lines 13. For a hardmask material 73 that contains metals, electroless plating or selective CVD, or ALD processed can be used. For a silicon or polysilicon hardmask material 73, epitaxial silicon or polysilicon growth may be used.

In the presented examples, where the mask material 73 of the mask lines 13 is a seeded polymer or other hardmask material, an encapsulation insulating material 51 formed prior to the photoresist deposition and angled cut of FIGS. 5A through 6B confines nucleation and growth of the extension contact landing pad masks 23 to the mask material 73 exposed at the angled ends 22 of the mask lines 13. For BCP cylinders, matrix phase material surrounding the BCP cylinders could also be used to confine growth to the angled ends 22 of the mask lines 13.

Also, in the presented examples, a trim or etch-back may be applied to the encapsulation insulating material 51, pulling the material 51 back away from the exposed angled ends 22 of the mask lines 13. A trim or etch-back may or may not be applied in order to regulate the amount of exposed surface for the subsequent selective deposition and contact landing pad growth steps. For electroless plating or selective CVD or ALD processes, the contact landing pad masks 23 may be grown isotropically, as shown in FIG. 7, or anisotropically, as shown in FIGS. 8 and 9A. For epitaxial silicon or polysilicon growth, the contact landing pad masks 23 may be grown anisotropically.

Figure 9B:
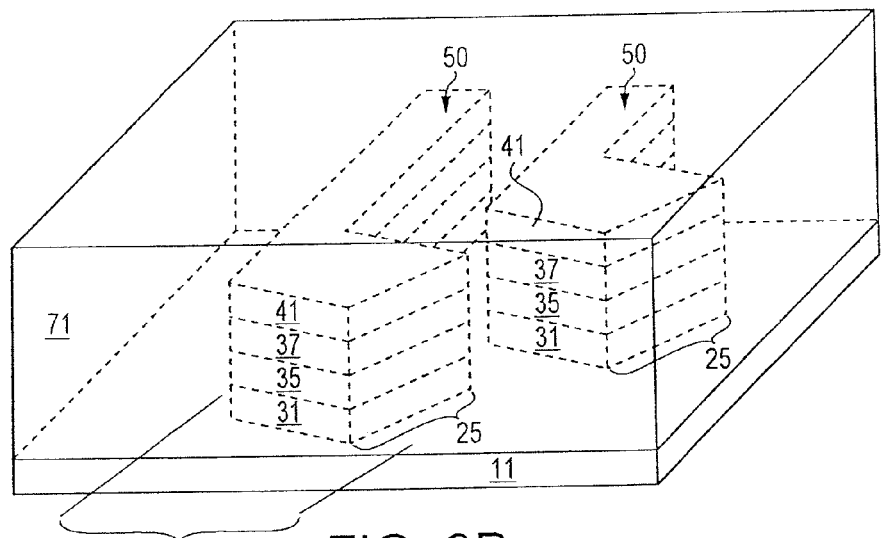
Figure 9C:
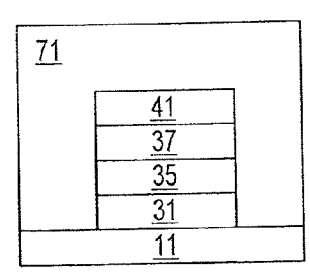

Once the self-aligned contact landing pad mask 23 is grown, using any of the processes described above, the combined mask pattern can be transferred to the underlying materials via etch to form spaced conductive lines having sufficiently large contact landing pads. FIG. 9A illustrates a perspective view of the mask lines 13 with extension contact landing pad masks 23 grown at the angled ends 22. The mask lines 13 and associated contact landing pad masks 23 are then used as a hard mask for etching through the underlying materials 31, 35, 37, 41. In FIG. 9B, the combined mask pattern has been transferred to the underlying materials via etch, the remaining mask material has been removed, and an insulating material 71, such as a boron phosphorous silicon glass material has been deposited. The resulting conductive lines 50, which may be provided for use as word lines, have a gate oxide 31, a polysilicon 35, a metal silicide 37, and oxide top material 41. The conductive lines 50 each have a contact landing pad area 25 formed at an end. The angled cut of mask lines 13 and selective growth of extension contact landing pad masks 23 at the mask layer enables the patterning of a sufficiently large electrical contact landing pad area 25, even though the conductive lines 50 may be closely spaced. The electrical contact landing pad areas 25 are sufficiently large to provide an electrical connection to the conductive lines 50, but are spaced apart a sufficient amount to provide electrical isolation among the respective electrical contact landing pad areas 25. FIG. 9C shows a cross section view of the electrical contact landing pad areas 25 of the conductive lines 50 of FIG. 9B.

Figure 10A:
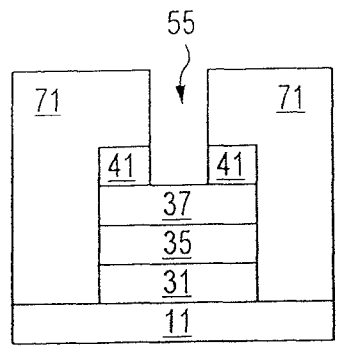
FIGS. 10A and 10B illustrate cross-sectional views of the formation of an electrical connection to a contact landing pad.
Figure 10B:
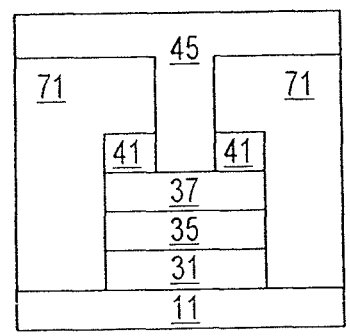

FIGS. 10A and 10B illustrate a method of forming electrical connections to the electrical contact landing pad area 25 illustrated in FIG. 9C. In FIG. 10A, a via 55 is formed using conventional techniques. The via is formed through the insulating material 71 and the oxide top material 41, down to the metal silicide 37. A conductive material 45, e.g. polysilicon or metal, is deposited over the insulating material 71, forming an electrical connection to the metal silicide material 37. Thus, electrically isolated electrical connections can be made even though the conductive lines 50 are closely spaced. Though this embodiment is described with reference to forming connections to conductive lines 50 on a semiconductor substrate 11, it should be understood that the technique described herein could be applied to form electrical connections to conductive lines 50 in any conductive layer of a semiconductor device.

Figure 11A:
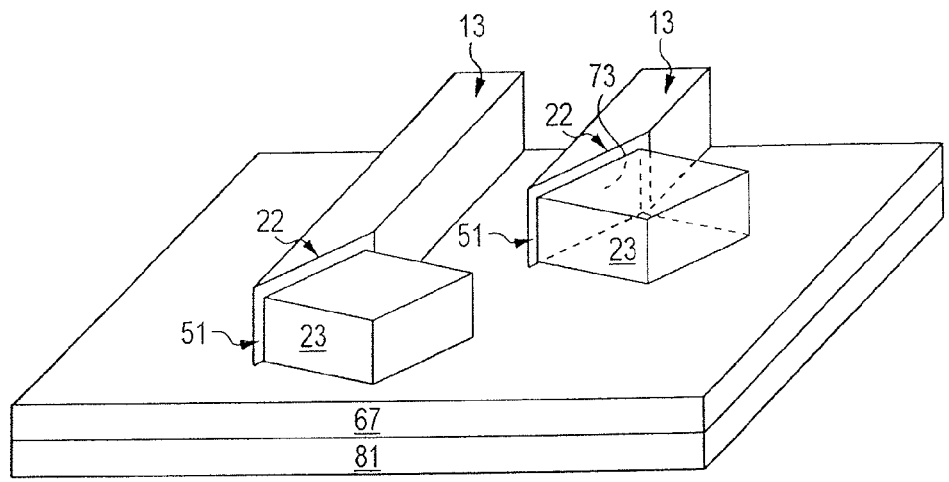
FIGS. 11A through 11C illustrate perspective and cross-sectional views of an embodiment with single-layer conductive lines.
Figure 11B:
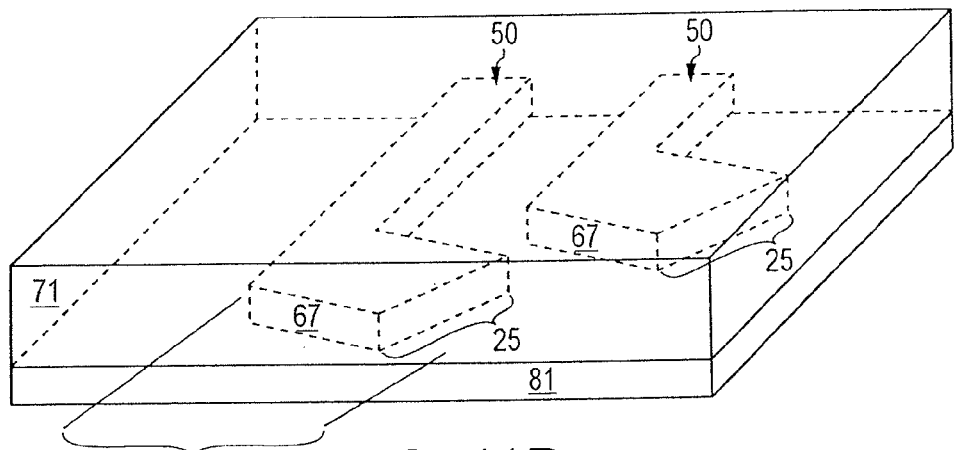
Figure 11C:
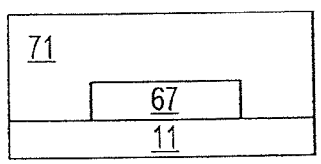

FIGS. 11A through 11C illustrate another embodiment wherein the mask lines 13 with extension contact landing pad masks 23 grown at the angled ends 22 are used to etch into an underlying conductive material. In this embodiment, the conductive material comprises a single metal layer 67 which may, for example, be provided along an upper level of a semiconductor device. The metal layer 67 is here shown above an insulating material 81, but it could be at any layer of the semiconductor structure. The mask lines 13 with extension contact landing pad masks pads 23 are formed using the same growth techniques described above in reference to FIGS. 7, 8 and 9A, including electroless deposition, selective CVD or ALD processes, or epitaxial silicon or polysilicon growth, as examples, depending on the material 73 used for the mask lines 13. An electrical connection can be made to the electrical contact landing pad 25 illustrated in FIG. 11C using the same technique described above in reference to FIGS. 10A and 10B.

Figure 12A:
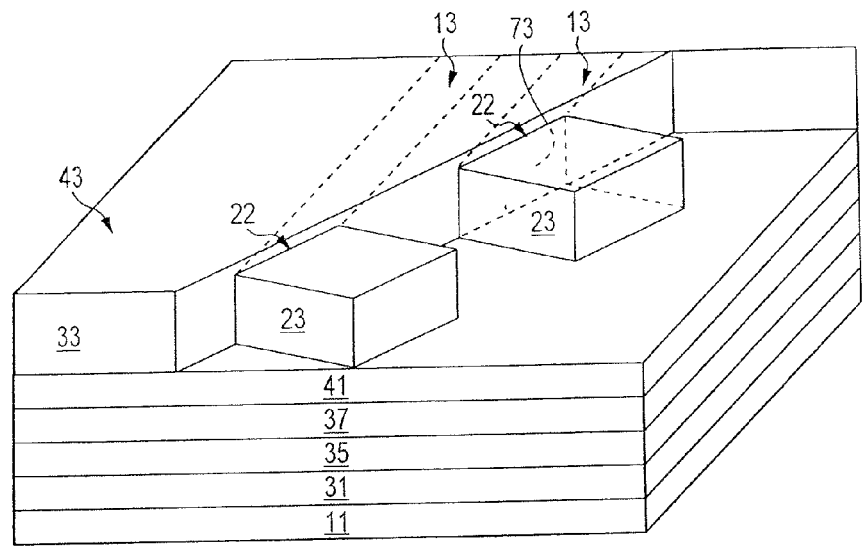
FIGS. 12A through 12C illustrate perspective and cross-sectional views of an embodiment using a cutting mask as an insulating material to confine growth of mask pads.
Figure 12B:
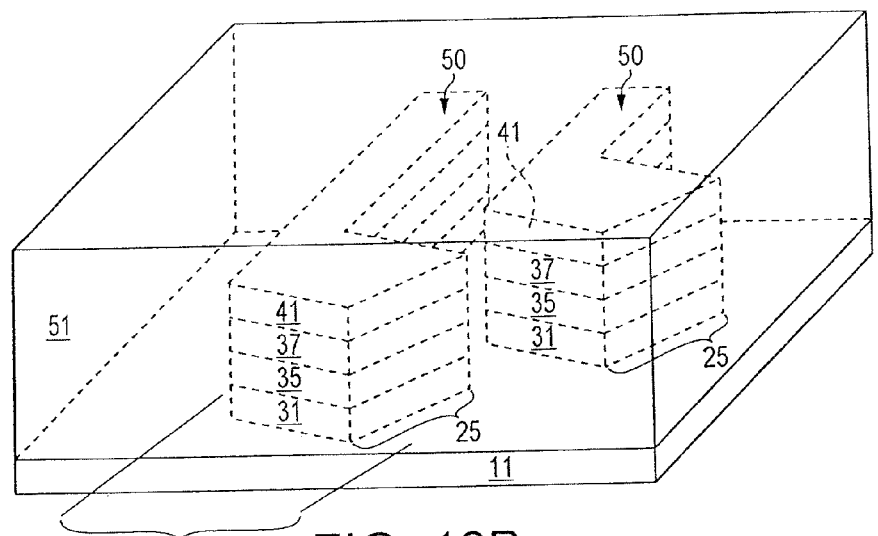
Figure 12C:
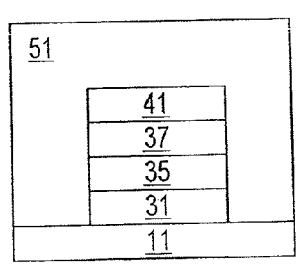

FIGS. 12A through 12C illustrate yet another embodiment wherein the mask lines 13 with extension contact landing pad masks 23 grown at the angled ends 22 are used to etch into an underlying material stack which may be used for wordlines. This embodiment differs from the embodiment illustrated in FIGS. 9A through 9C in that the lines of mask material 73 are not covered with encapsulation insulating material 51. Here, the photoresist material 33 forming the cutting mask 43 is applied directly over material 73 of lines 13 and is not removed after the mask lines 13 are cut. As a result, the cutting mask 43 acts as an encapsulating growth-confining material during the growth of the extension contact landing pad masks 23, so that growth occurs only at the exposed ends 22 of the mask lines 13. A optional trim or etch-back may be applied to the photoresist material 33 in order to regulate the amount of exposed surface of material 73 for the subsequent selective deposition and contact landing pad growth steps. As in the FIGS. 7, 8 and 9A embodiments, contact landing pad masks 23 can be grown using any selective deposition technique, including electroless deposition, selective CVD or ALD processes, or epitaxial silicon or polysilicon growth, as examples, depending on the material used for the mask 73. A connection can be made to the electrical contact landing pad 25 illustrated in FIG. 12C using the same technique described above in reference to FIGS. 10A and 10B.

Figure 13:
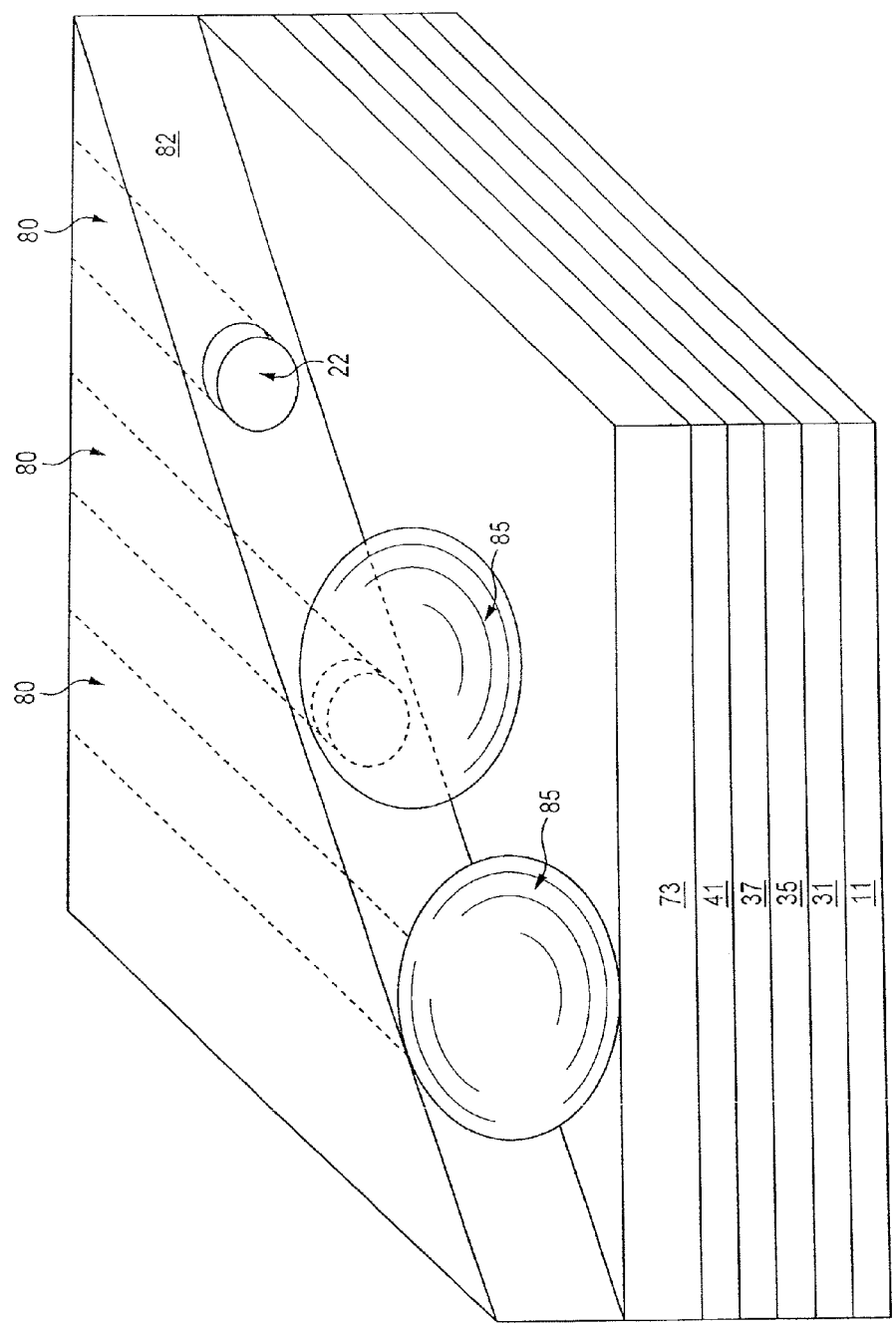
FIG. 13 illustrates a perspective view of an embodiment with parallel BCP cylinders having angled faces and isotropically grown mask pads.

In another embodiment, BCP cylinders with extension pad masks 85 are used to pattern both the mask lines 13 and the contact landing pad masks 23. FIG. 13 shows a mask material 73 covered by a self-assembled BCP material with BCP cylinders 80 (comprising, for example, PS) formed in a matrix phase material 82 (comprising, for example PMMA). The BCP cylinders can be formed with a half-pitch below 20 nm. The matrix phase material 82 has been selectively exposed to light at an angle across the extending direction of the BCP cylinders 80, and placed in a suitable developer to form an angled mask. The mask formed of the matrix phase material 82 is then used as a cutting mask to cut angled ends 22 in the BCP cylinders 80. Alternatively, the mask and cut could be performed using a conventional photoresist material 33 above the BCP material as a cutting mask 43 to cut the BCP cylinders 80 and the matrix phase material 82 at an angle (or to cut only the BCP cylinders 80 at an angle, if the matrix phase material 82 is removed prior to the mask and cut). An optional trim or etch-back may be applied to the matrix phase material 82. The BCP cylinders may be stained with a metal, such as Pt, W, or other similar metal in order to enhance pattern transfer characteristics and provide a seed material for selective deposition. To form extension mask pads 85 (which will be used to pattern contact landing pad masks 23 in the underlying material), a material at the exposed angled ends 22 of the BCP cylinders 80, such as the stained Pt, W, or other similar metal, acts as seed for growth. Selective deposition of materials on this seed can be performed using processes such as electroless plating or selective CVD or ALD processes. In this embodiment, the matrix phase material 82 or cutting mask 43 confines nucleation and growth of the extension mask pads 85 to the angled ends 22. The extension mask pads 85 may be isotropically (shown) or anisotropically grown.

Figure 14:
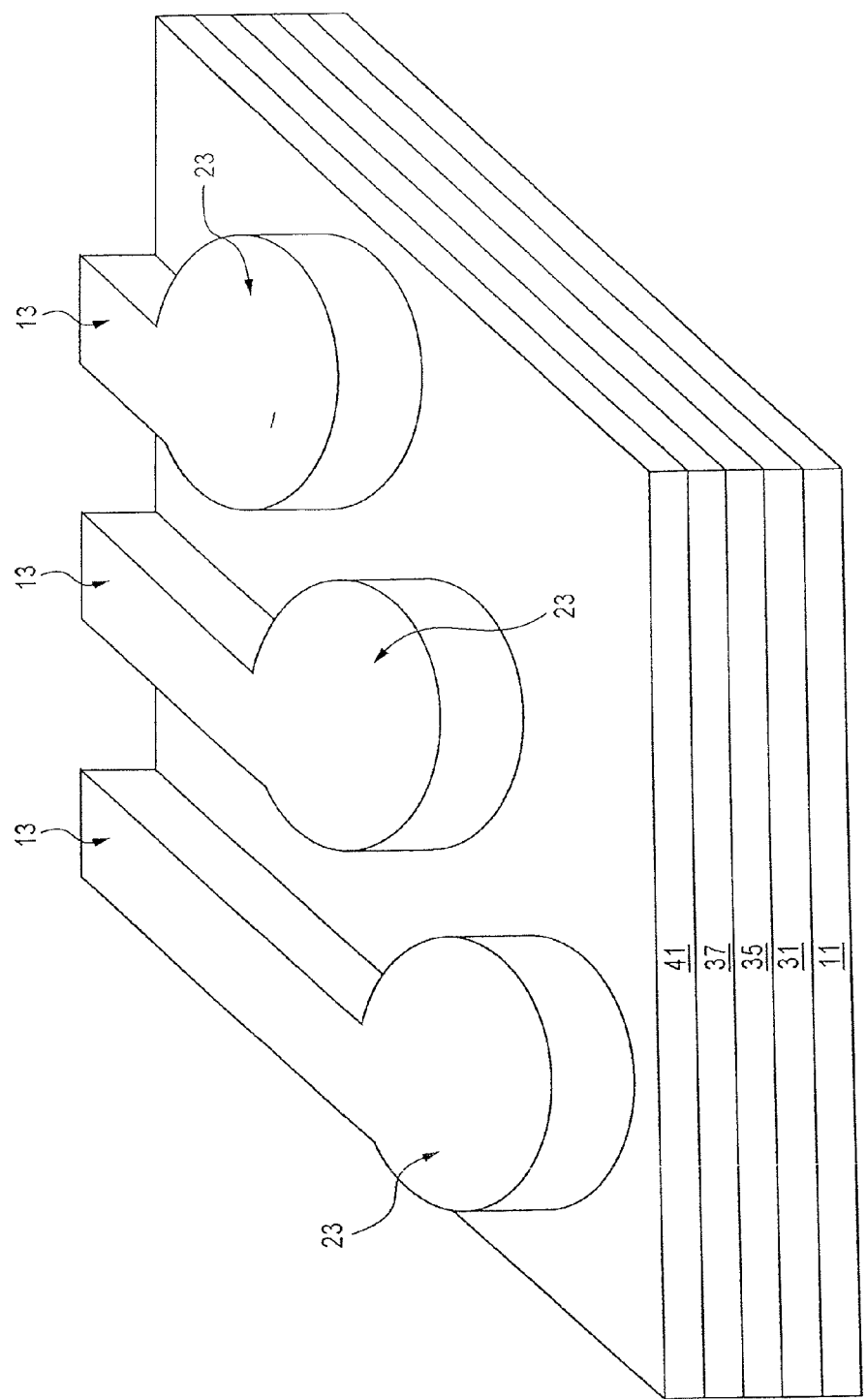
FIG. 14 illustrates a perspective view of the embodiment of FIG. 13 after the BCP cylinders and respective mask pads have been used as an etch mask to etch underlying conductive materials.

Once the extension mask pads 85 have been formed, the matrix phase material 82 is removed through appropriate etching or developing techniques known in the art. The remaining BCP cylinders 80 with extension masks pads 85 can be used as a mask to etch a blanket deposited underlying hard mask material 73. FIG. 14 shows the mask lines 13 with the attached contact landing pad masks 23 formed by this etch of material 73. The remaining underlying materials, including materials 41, 37, 35, and 31, can then be etched using mask lines 13 and the contact landing pad masks 23 using the process described above in reference to FIGS. 9B and 9C. Electrical connections to the resulting contact landing pads 25 can be formed using the process described above in reference to FIGS. 10A and 10B.

Figure 15:
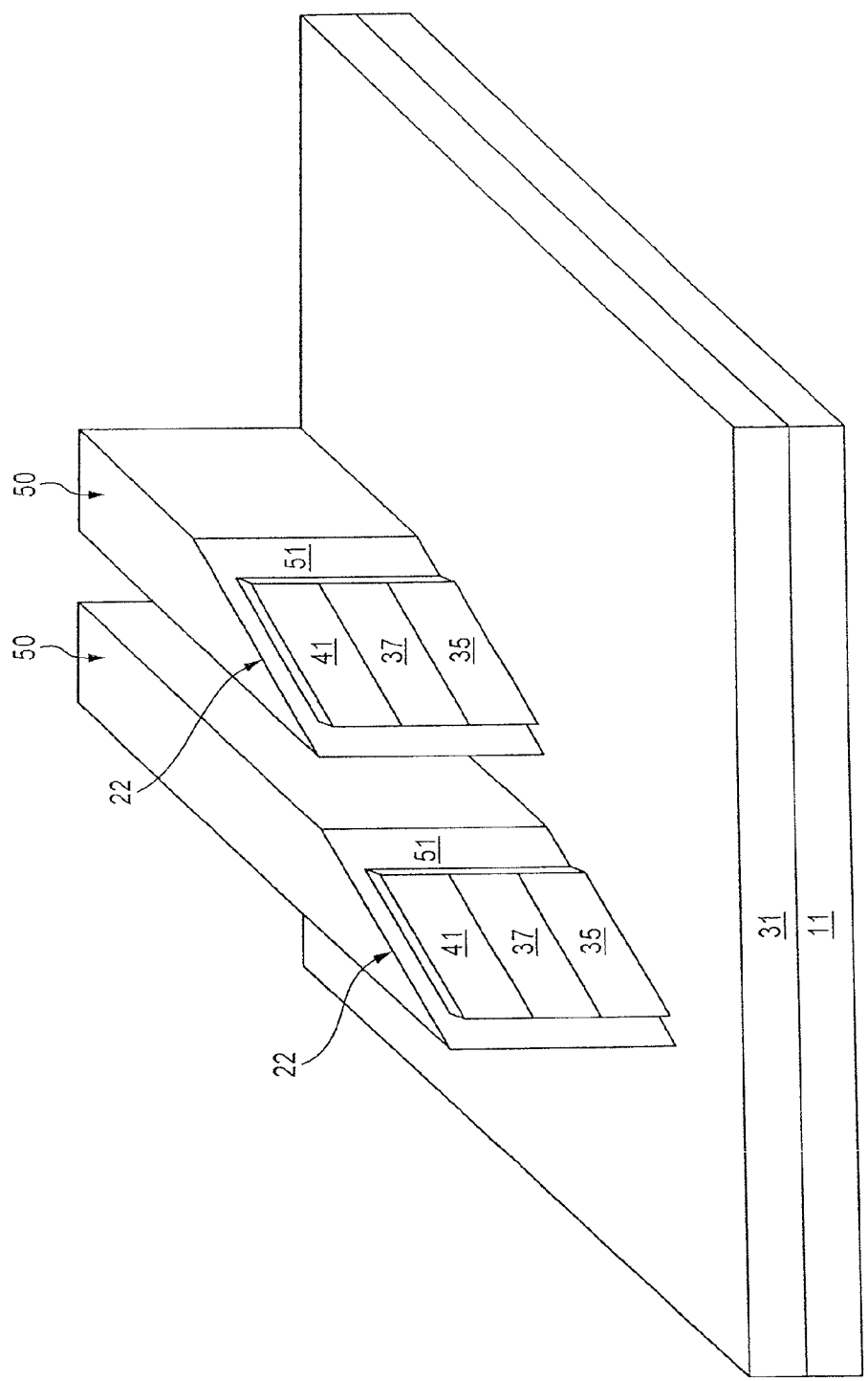
FIG. 15 illustrates a perspective view of example conductive lines after cutting angled line ends in accordance with another embodiment.

In another embodiment, line extensions forming electrical contact landing pads 25 can be grown directly on the conductive lines 50. FIG. 15 illustrates a perspective view of example conductive lines 50, such as a wordlines. As an example, these conductive lines 50 have been formed with, an oxide top material 41, a metal silicide 37, and a polysilicon 35 over a gate oxide 31 and a semiconductor substrate 11. The gate oxide 31 is not etched into the conductive line patterns, so that the later formed contact landing pads 25 will be electrically isolated from the semiconductor substrate 11. An insulating material 51, such as an oxide, encapsulates the material stack 35, 37, 41. If the conductive lines 50 are patterned using current double patterning and spacer pitch doubling techniques, the half pitch of the lines may be between about 45 nm and about 20 nm. Using self-assembled BCP mask and etch techniques, the half pitch of the patterned conductive lines 50 may be from about 20 nm and below.

The conductive lines 50 of FIG. 15 have all been cut at an angle, i.e. an angle of between 5 degrees and 30 degrees relative to the linearly extending direction to form angled ends 22, using the angled cutting mask technique illustrated in FIGS. 4A through 6B to cut the conductive lines 50 and form angled ends 22. In FIG. 15, a trim or etch-back has been performed on the encapsulation insulating material 51, removing material 51 away from the exposed face of materials 31, 35, 37, and 41. A trim or etch-back may or may not be performed in order to regulate the amount of exposed surface for the subsequent electrical contact landing pad 25 growth step. The conductive lines 50 illustrated in FIG. 15 are an example of one conductive line configuration, but the technique described herein can be applied to conductive lines having other configurations and with other conductive materials, for example, a metal line.

Figure 16:
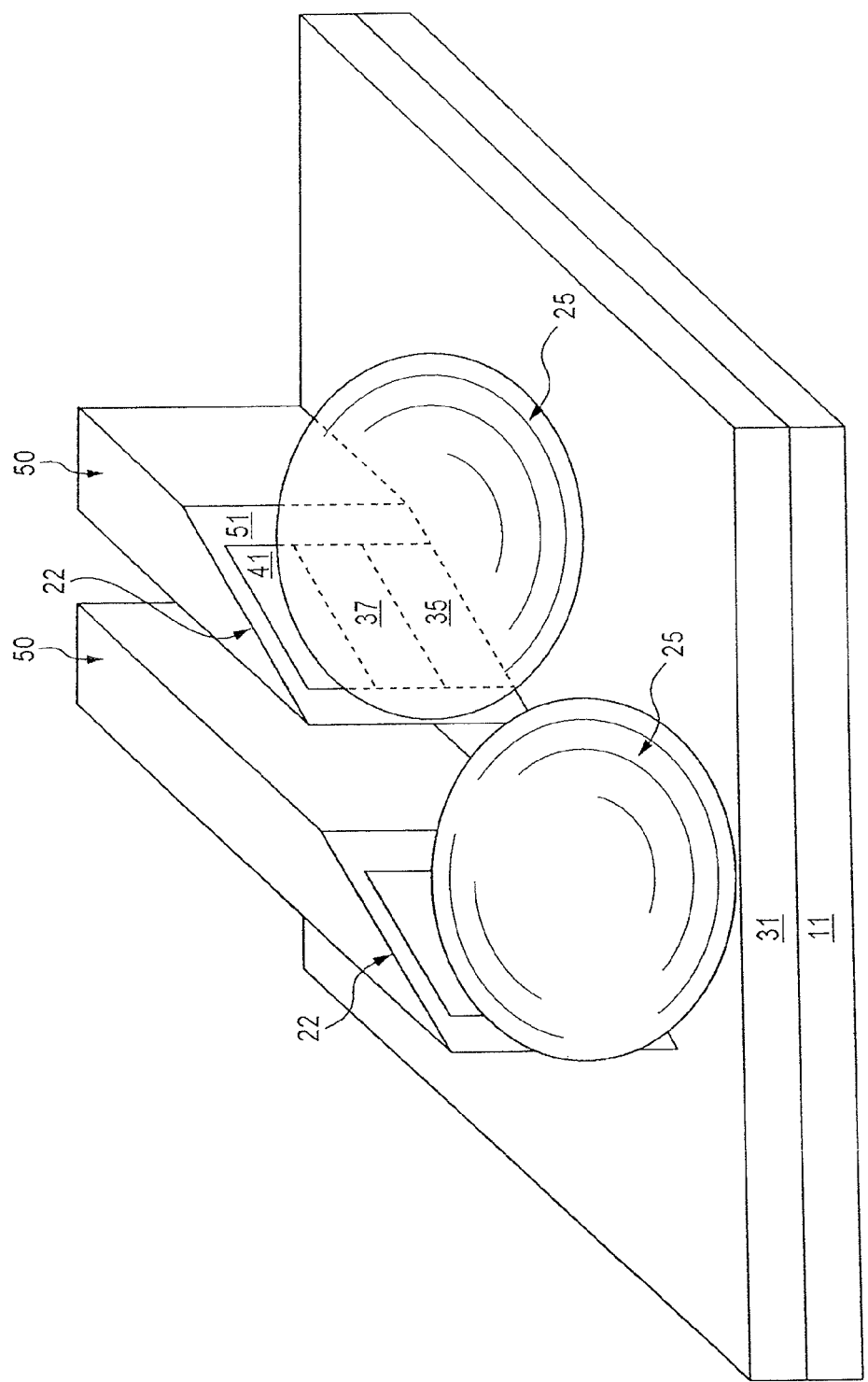
FIG. 16 illustrates a perspective view of an embodiment with parallel conductive lines having angled faces and isotropically grown electrical contact landing pads.

FIG. 16 illustrates isotropic growth of an electrical contact landing pad 25 from an embodiment with parallel conductive lines 50 having angled ends 22 with no trim or etch back. In this embodiment, like that of FIG. 15, a encapsulation insulating material 51 is formed over conductive lines 50. The extension electrical contact landing pads 25 are formed by using materials exposed at the angled ends 22, such as the polysilicon 35 and/or the metal silicide 37, as examples, as a seed to isotropically grow an electrical contact landing pad 25 at the exposed ends of the conductive line 50. Selective deposition of conductive materials on this seed can be performed using processes such as electroless plating or selective CVD or ALD. The encapsulation insulating material 51 confines nucleation and growth to the angled ends 22. The electrical contact landing pads 25 are self-aligned to the angled end 22, the latter of which forms the seed layer for electrical contact landing pad 25 growth. FIG. 16 shows the electrical contact landing pad 25 as an isotropic growth, however, an anisotropic growth may also be performed.

Figure 17A:
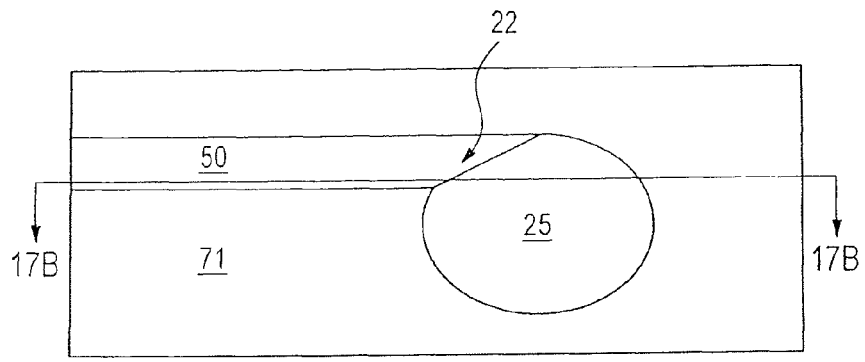
FIGS. 17A and 17B illustrate an example technique for forming electrical connections to the electrical contact landing pads formed in FIG. 16.

FIG. 17A shows in top view and 17B shows in cross sectional view a method of making an electrical connection to a conductive line 50 having an electrical contact landing pad 25, such as the conductive line of FIG. 16. The conductive line 50 has been cut at an angle, and an electrical contact landing pad 25 has been isotropically grown from the angled end 22. Using conventional techniques, a via 55 is formed through an insulating material 71 above the electrical contact landing pad 25. A connecting metal material 45 is deposited over the insulating layer and the via 55 so that it forms a connection to the electrical contact landing pad 25.

Figure 17B:
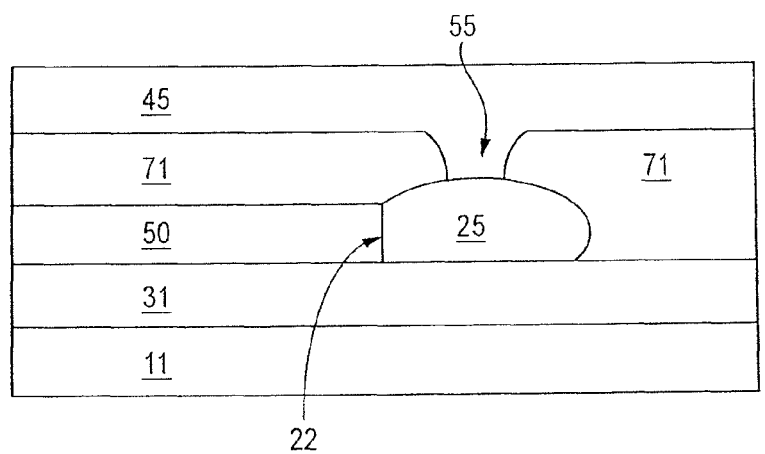
Figure 18:
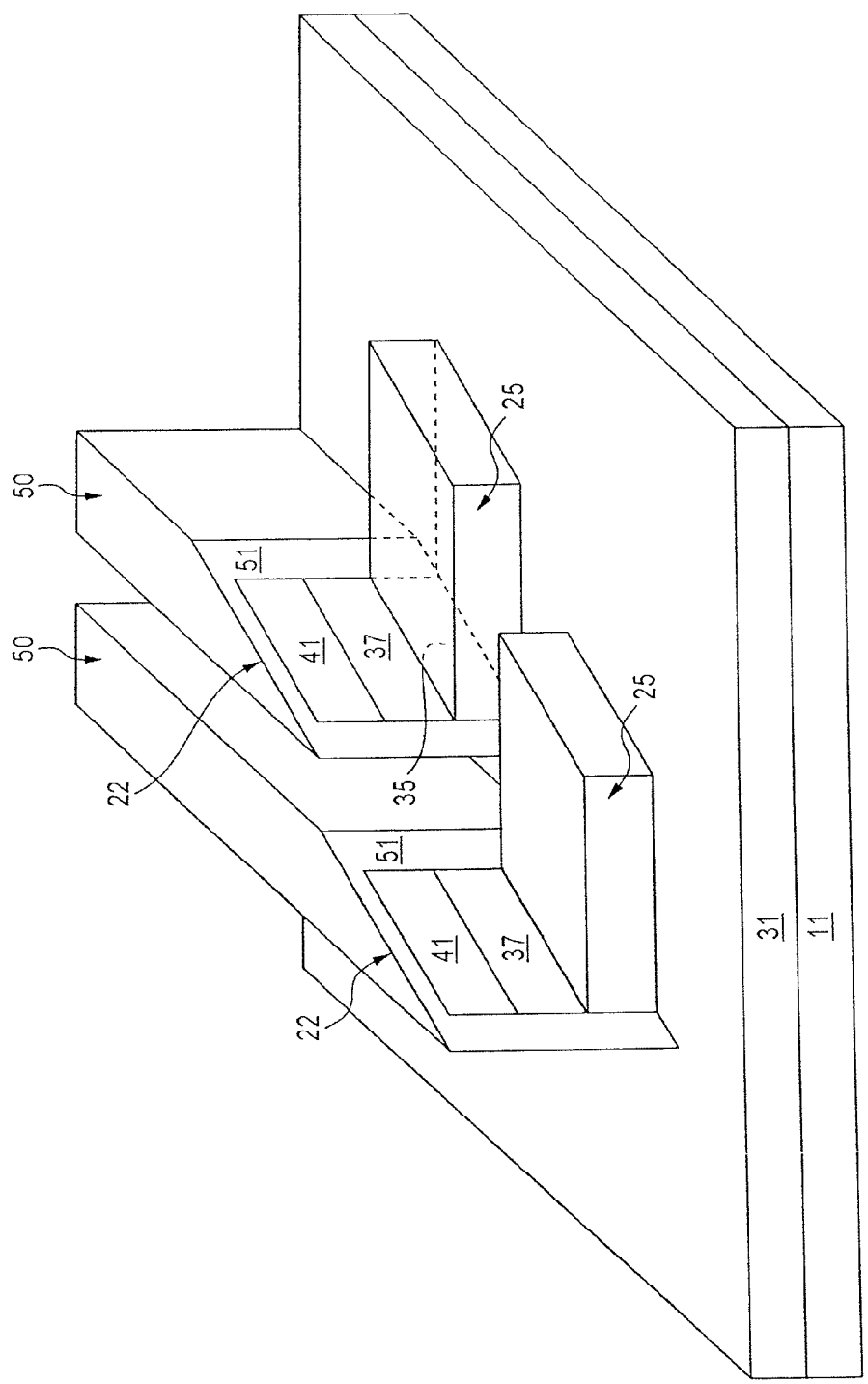
FIG. 18 illustrates a perspective view of an embodiment with parallel conductive lines having angled faces and anisotropically grown electrical contact landing pads.

FIG. 18 illustrates a perspective view of another embodiment with conductive lines 50 having the construction of FIG. 15 and having angled ends 22 and here showing anisotropically grown electrical contact landing pads 25. In this embodiment, like that of FIG. 16, an encapsulation insulating material 51 is formed over the conductive lines 50, and no etch-back has been applied at the angled ends 22. The extension electrical contact landing pads 25 are formed using the same growth techniques described above in reference to FIG. 16, including electroless deposition or selective CVD or ALD on the polysilicon 35 and/or the metal silicide 37 materials. An electrical connection can be made to the electrical contact landing pad 25 illustrated in FIG. 18C using the same technique described above in reference to FIGS. 17A and 17B.

Figure 19:
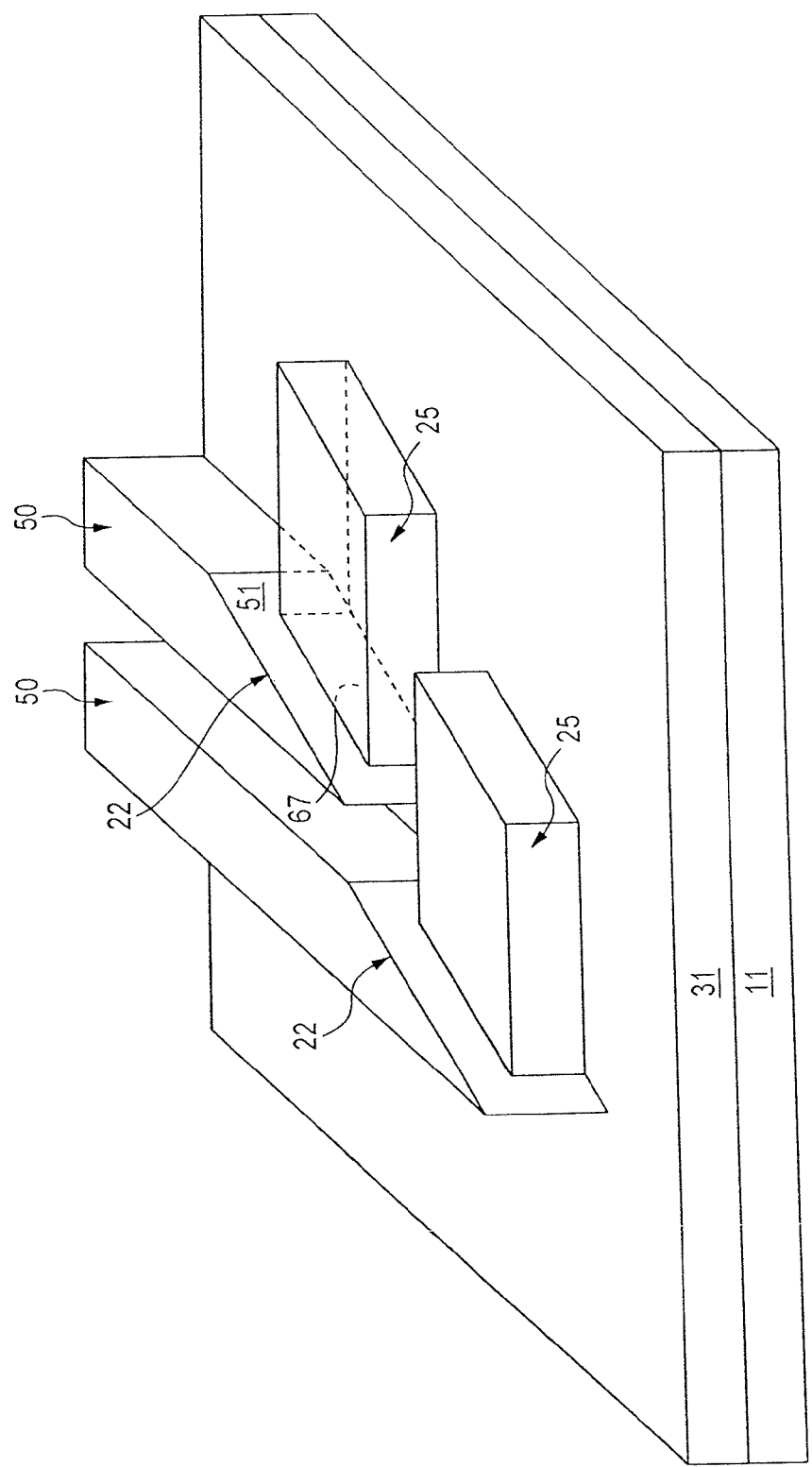
FIG. 19 illustrates a perspective view of another embodiment with a single metal layer forming conductive lines having angled faces and anisotropically grown electrical contact landing pads.

FIG. 19 illustrates another embodiment with conductive lines 50 having angled ends 22 and anisotropically grown electrical contact landing pads 25. The embodiment of FIG. 19 differs from the embodiment of FIG. 18 in that the conductive line 50 comprises a single metal layer 67 encapsulated by insulating material 51. As in the FIG. 18 embodiment, extension electrical contact landing pads 25 are formed by using material exposed at the angled ends 22, here the metal layer 67, as a seed to anisotropically grow an electrical contact landing pad 25 at the exposed ends of the conductive line 50. Selective deposition of materials on this seed can be performed using processes such as electroless plating, or selective CVD or ALD processes. FIG. 19, like FIG. 18, shows the electrical contact landing pad 25 as an anisotropic growth. Connections can be made to the electrical contact landing pads 25 using the process described above in reference to FIGS. 17A and 17B.

Figure 20:
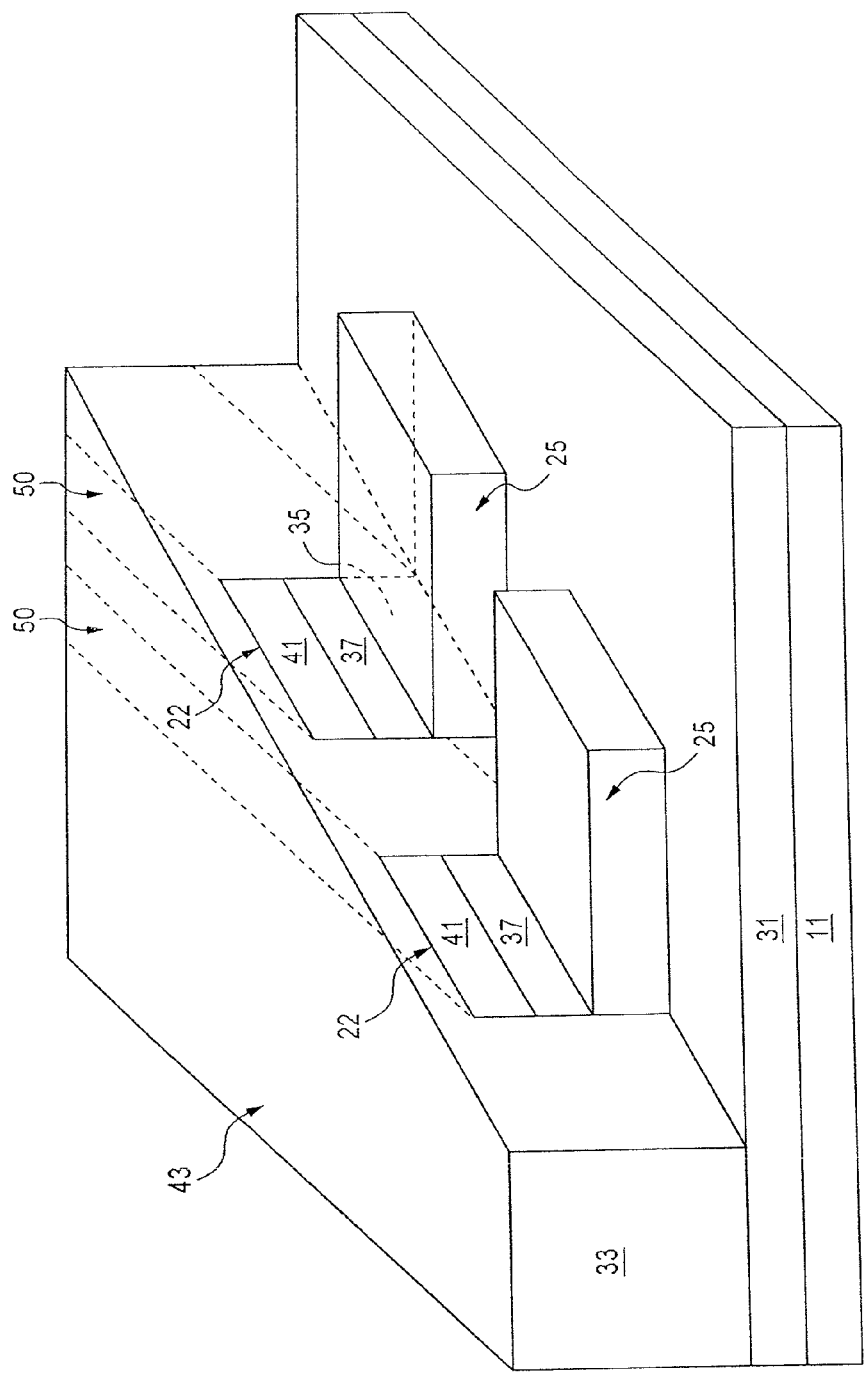
FIG. 20 illustrates a perspective view of an embodiment using a cutting mask as an insulating material to confine growth of electrical contact landing pads.

FIG. 20 illustrates a perspective view of another embodiment with conductive lines 50 having angled ends 22 with anisotropically grown electrical contact landing pads 25. The embodiment of FIG. 20 differs from the embodiments of FIGS. 15 through 18 in that the conductive lines 50 are not individually covered by a respective insulating material 51. In this embodiment, the photoresist material 33 forming the cutting mask 43 is not removed after the conductive lines 50 are cut, and the cutting mask 43 acts as an encapsulating growth-confining material during the growth of the electrical contact landing pads 25, so that growth occurs only at the exposed ends 22 of the conductive lines 50. As in other embodiments, an etch back may or may not be performed on to the photoresist material 33 at the angled ends 22 of the conductive lines 50. Extension electrical contact landing pads 25 are formed using the same growth techniques described above in reference to FIG. 16, including electroless deposition or selective CVD or ALD on polysilicon 35 and/or metal silicide 37, as examples. Connections can be made to the electrical contact landing pads 25 using the process described above in reference to FIGS. 17A and 17B.

Figure 21:
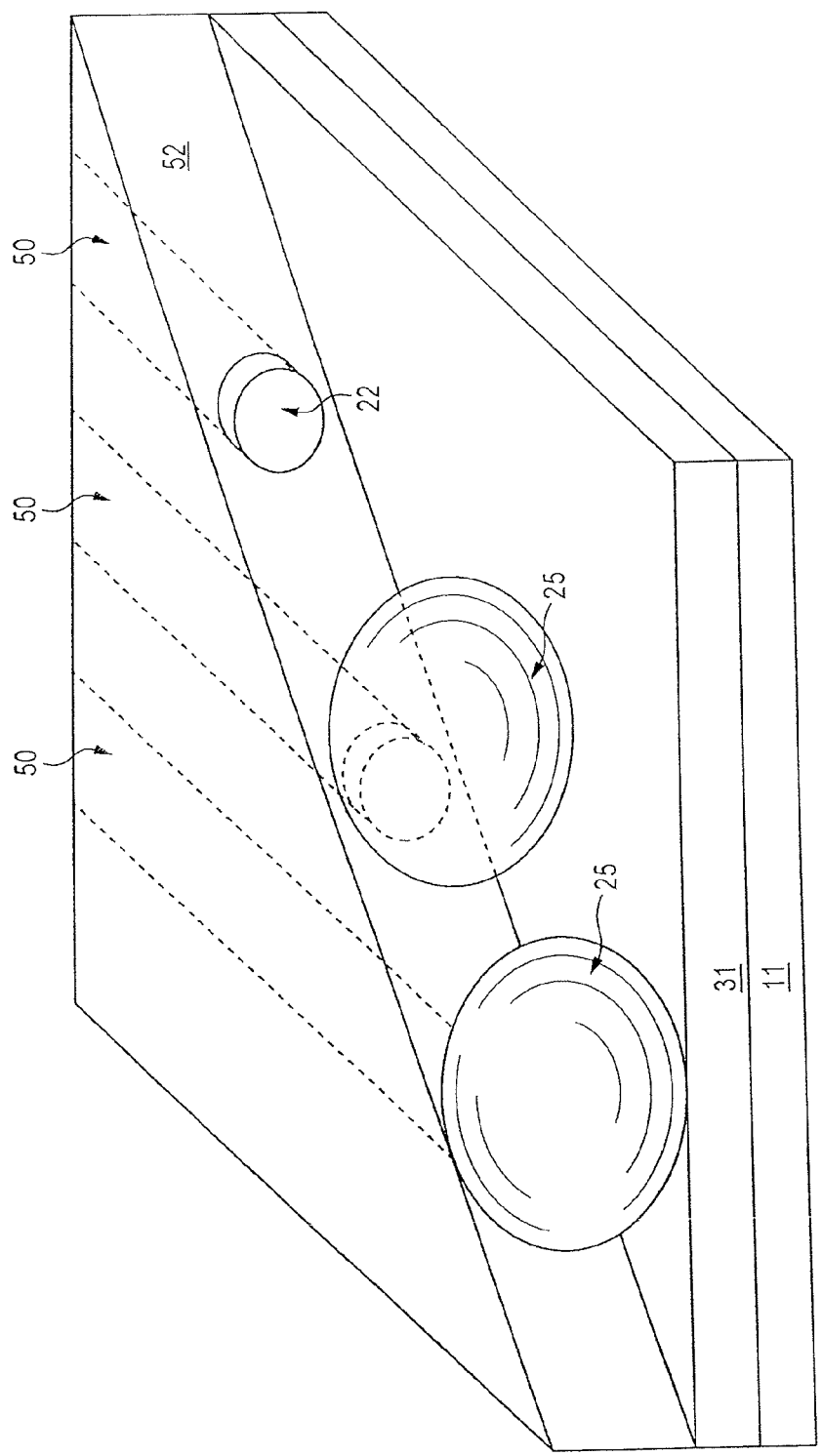
FIG. 21 illustrates a perspective view of an embodiment with parallel BCP cylinders forming conductive lines with angled faces and isotropically grown electrical contact landing pads.

FIG. 21 illustrates an embodiment with metalized BCP cylinders 80 forming conductive lines 50 with extension contact landing pads 25. A self-assembled BCP material with BCP cylinders 80 (comprising, for example, PS) formed in a matrix phase material 82 (comprising, for example PMMA) is formed over a gate oxide material 31. The matrix phase material 82 has been selectively exposed to light at an angle across the extending direction of the BCP cylinders 80, and placed in a suitable developer to form an angled mask. The mask formed of the matrix phase material 82 is then used as a cutting mask to cut angled ends 22 in the BCP cylinders 80. Alternatively, the mask and cut could be performed using a conventional photoresist material 33 above the BCP material as a cutting mask 43 to cut the BCP cylinders 80 and the matrix phase material 82 at an angle (or to cut only the BCP cylinders 80 at an angle, if the matrix phase material 82 is removed prior to the mask and cut). An optional trim or etch-back may be applied to the matrix phase material 82 (or a cutting mask 43), pulling the material 82 back away from the exposed angled ends 22 of the BCP cylinders 80. The BCP cylinders may be stained with a metal, such as Pt, W, or other similar metal in order to functionalize them as a conductive line and to provide a seed material for selective deposition. To form extension electrical contact landing pads 25, a material at the exposed angled ends 22 of the BCP cylinders 80, such as the stained Pt, W, or other similar metal, acts as seed for growth. Selective deposition of materials on this seed can be performed using processes such as electroless plating or selective CVD or ALD processes. In this embodiment, the matrix phase material 82 confines nucleation and growth of the electrical contact landing pads to the angled ends 22. A photoresist material 33 could perform the same function as the matrix phase material 82 in this embodiment. The contact landing pads 25 may be isotropically (shown) or anisotropically grown.

The above description and drawings are only to be considered illustrative of specific embodiments, which achieve the features and advantages described herein. Modifications and substitutions for specific conditions and materials can be made. Accordingly, the embodiments are not considered as being limited by the foregoing description and drawings, but is only limited by the scope of the appended claims.

What is claimed as new and desired to be protected by Letters Patent of the United States is:

1. An integrated circuit structure comprising:
   a plurality of linearly extending material stack lines each comprising a polysilicon material, a metal silicide material, and an oxide top material, the material stack lines formed as part of the integrated circuit and each having an angled end face at a different location along the linearly extending direction of the material stack lines; and
   a contact landing pad formed in electrical contact with each angled end face.

2. The integrated circuit structure of claim 1, wherein the material stack lines have a half-pitch of less than 45 nm.

3. The integrated circuit structure of claim 1, wherein the material stack lines have a half-pitch of less than 20 nm.

4. The integrated circuit structure of claim 1, wherein the angled end faces are at an angle of between 5 degrees and 30 degrees relative to the linearly extending direction.

5. The integrated circuit structure of claim 1, wherein the material stack lines are parallel material stack lines.

6. The integrated circuit structure of claim 1, wherein the material stack lines form at least one of wordlines and bitlines of a memory device.

7. The integrated circuit structure of claim 1, wherein the material stack lines are at least partially covered by an insulating material.

8. The integrated circuit structure of claim 1, wherein the contact landing pads each comprise a polysilicon material, a metal silicide material, and an oxide top material.

9. The integrated circuit structure of claim 8, further comprising:
   an insulating material formed over the material stack lines and the contact landing pads;
   a respective via formed through the insulating material and the oxide top material of each contact landing pad; and
   a respective conductive material formed in each respective via and in electrical connection with the metal silicide material of each respective contact landing pad.

10. An integrated circuit structure comprising:
    a plurality of linearly extending block copolymer cylinders formed as part of the integrated circuit structure and each having an angled end face at a different location along the linearly extending direction of the block copolymer cylinders; and
    a contact landing pad formed in contact with each angled end face.

11. The integrated circuit structure of claim 10, wherein said block copolymer cylinders comprise polystyrene.

12. The integrated circuit structure of claim 10, wherein said block copolymer cylinders are metalized block copolymer cylinders.

13. The integrated circuit structure of claim 10, wherein said block copolymer cylinders have a half-pitch of less than 20 nm.

14. The integrated circuit structure of claim 10, wherein said angled end faces are at an angle of between 5 degrees and 30 degrees relative to the linearly extending direction.

15. The integrated circuit structure of claim 10, wherein the block copolymer cylinders are parallel block copolymer cylinders.

16. The integrated circuit structure of claim 10, wherein the block copolymer cylinders form at least one of wordlines and bitlines of a memory device.

17. The integrated circuit structure of claim 10, further comprising:
    a material stack formed below the block copolymer cylinders.

18. The integrated circuit structure of claim 10, wherein said block copolymer cylinders include a metal seed material incorporated in the polymer structure by blending or reacting.

19. The integrated circuit structure of claim 10, wherein said block copolymer cylinders include a metal seed material selectively formed at the angled end faces.

20. The integrated circuit structure of claim 17, wherein the material stack comprises a polysilicon material, a metal silicide material, and an oxide top material.

* * * * *